(12) United States Patent
Wu et al.

(10) Patent No.: US 9,409,766 B2
(45) Date of Patent: Aug. 9, 2016

(54) MEMS PACKAGE STRUCTURE AND MANUFACTURING METHOD THEREOF

(71) Applicant: Himax Display, Inc., Tainan (TW)

(72) Inventors: Tung-Feng Wu, Tainan (TW);
Wei-Hsiao Chen, Tainan (TW);
Chun-Hao Su, Tainan (TW); Jui-Wen Chen, Tainan (TW); Mao-Chien Cheng, Tainan (TW)

(73) Assignee: Himax Display, Inc., Tainan (TW)

( * ) Notice: Subject to any disclaimer, the term of this patent is extended or adjusted under 35 U.S.C. 154(b) by 0 days.

(21) Appl. No.: 14/743,678

(22) Filed: Jun. 18, 2015

(65) Prior Publication Data

US 2015/0284241 A1    Oct. 8, 2015

Related U.S. Application Data

(63) Continuation-in-part of application No. 14/167,819, filed on Jan. 29, 2014, now Pat. No. 9,102,513.

(51) Int. Cl.
| | |
|---|---|
| *H01L 23/02* | (2006.01) |
| *B81B 7/00* | (2006.01) |
| *B81C 1/00* | (2006.01) |
| *G02B 27/00* | (2006.01) |
| *G02B 26/08* | (2006.01) |

(52) U.S. Cl.
CPC ............ *B81B 7/0058* (2013.01); *B81B 7/0041* (2013.01); *B81C 1/00269* (2013.01); *G02B 27/0006* (2013.01); *B81B 2201/042* (2013.01); *B81C 2203/019* (2013.01); *G02B 26/0833* (2013.01)

(58) Field of Classification Search
None
See application file for complete search history.

(56) References Cited

U.S. PATENT DOCUMENTS

| | | | |
|---|---|---|---|
| 2005/0275075 A1 | 12/2005 | Hong et al. | |
| 2009/0115007 A1 | 5/2009 | Hong | |
| 2011/0057273 A1* | 3/2011 | O'Donnell | ............ B81C 1/0023 257/414 |
| 2013/0220874 A1 | 8/2013 | Lin et al. | |

FOREIGN PATENT DOCUMENTS

| | | |
|---|---|---|
| JP | 2006099065 | 4/2006 |
| JP | 2006121043 | 5/2006 |
| JP | 2007019107 | 1/2007 |
| JP | 2008166837 | 7/2008 |
| JP | 2009039843 | 2/2009 |
| TW | 200618210 | 6/2006 |
| TW | 200739838 | 10/2007 |

(Continued)

*Primary Examiner* — Jack Chen
(74) *Attorney, Agent, or Firm* — J.C. Patents

(57) ABSTRACT

A MEMS package structure includes a base, a MEMS device, a first cover, a second cover and a glass frit. The base includes a recess. The MEMS device is disposed in the recess. The first cover is disposed in the recess and covering the MEMS device. The second cover is disposed on the base and covering the recess. The glass frit is disposed between the base and the second cover. A MEMS package structure includes the base, the MEMS device, the first cover, a second cover, a first metal frame and a first sealing medium. The first metal frame is disposed around the second cover, and the second cover and the first metal frame collectively are disposed on the base and covering the recess. The first sealing medium is disposed between the first metal frame and the base. Manufacturing methods of the MEMS package structures above are further provided.

2 Claims, 7 Drawing Sheets

(56) References Cited

FOREIGN PATENT DOCUMENTS

| TW | 200921861 | 5/2009 |
| TW | 201012648 | 4/2010 |
| TW | 201103136 | 1/2011 |
| TW | I393454 | 4/2013 |

* cited by examiner

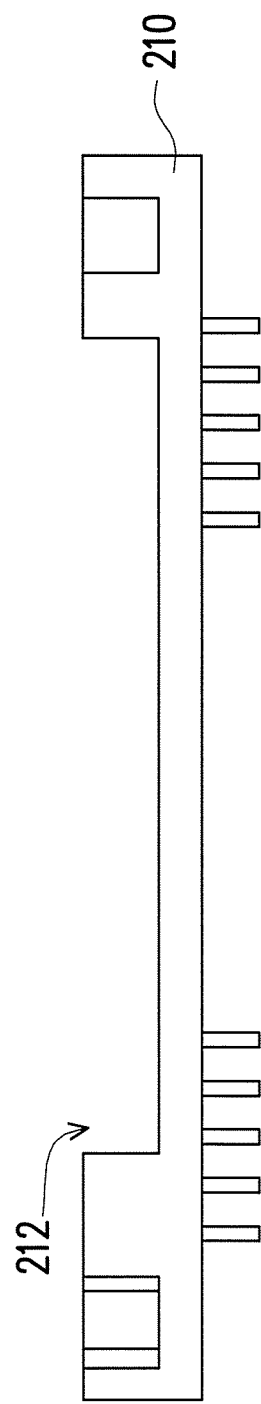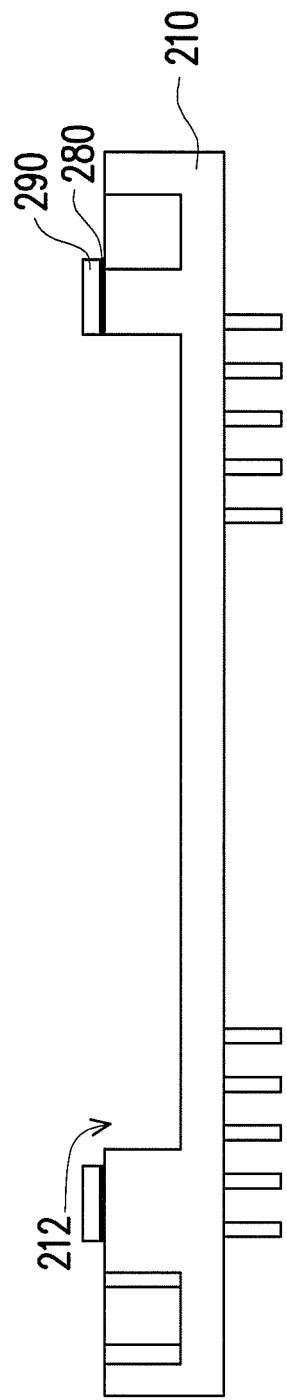
FIG. 2A
FIG. 2B

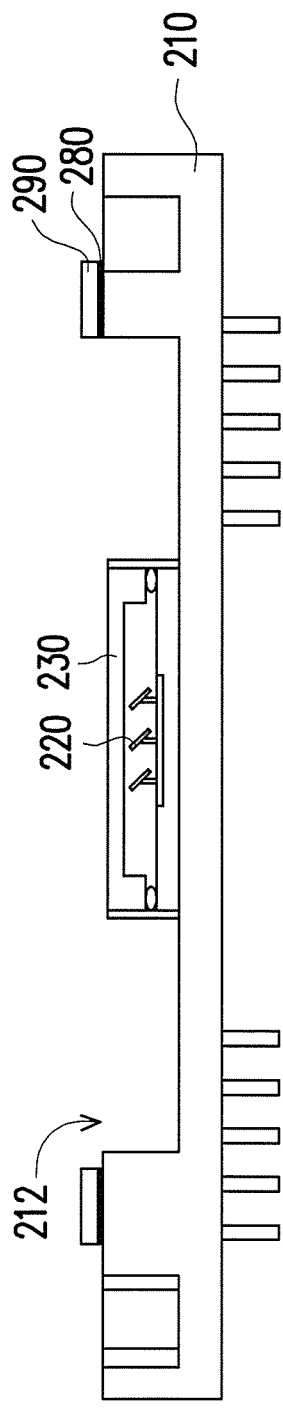
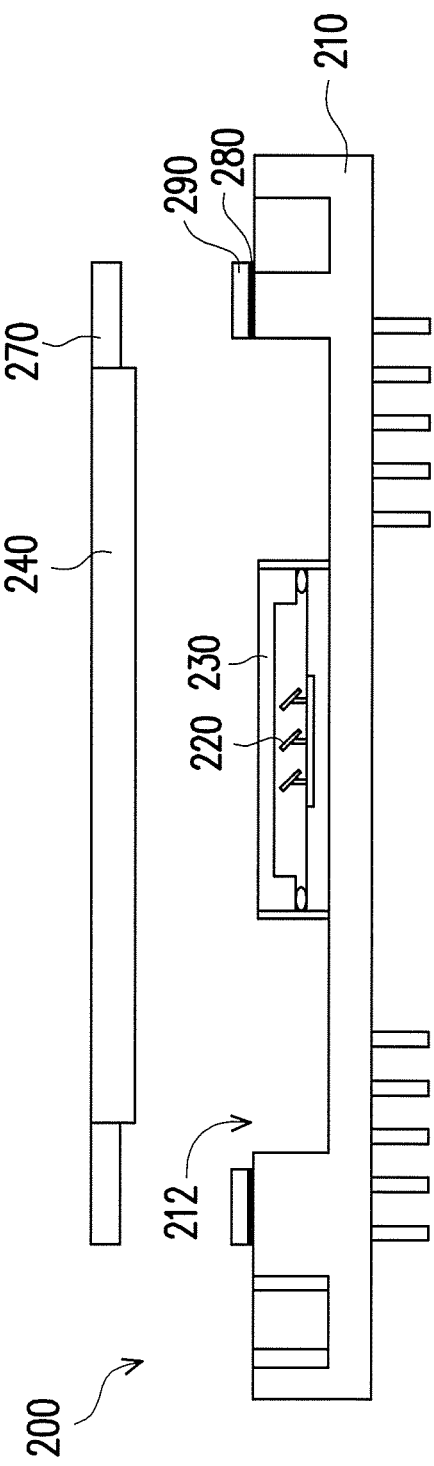

MEMS PACKAGE STRUCTURE AND MANUFACTURING METHOD THEREOF

CROSS-REFERENCE TO RELATED APPLICATION

This application is a continuation-in-part application of and claims the priority benefit of U.S. application Ser. No. 14/167,819, filed on Jan. 29, 2014, now allowed. The entirety of the above-mentioned patent application is hereby incorporated by reference herein and made a part of this specification.

BACKGROUND OF THE INVENTION

1. Field of the Invention

The present invention generally relates to a package structure and a manufacturing method thereof. More particularly, the present invention relates to a microelectromechanical system (MEMS) package structure and a manufacturing method thereof.

2. Description of Related Art

Microelectromechanical system (MEMS) is a microelectromechanical device fabricated in a microminiaturized package structure, and the fabricating technique thereof is quite similar to the technique of fabricating integrated circuits (ICs). However, interactions, for example, about mechanics, optics, or magnetic force between the MEMS device and surrounding environment are more than that of the conventional IC.

The MEMS device may include micro-sized electromechanical components (for example, switches, mirrors, capacitors, accelerometers, sensors, capacitive sensors, or actuators etc.), and the MEMS device may be integrated with the IC in a manner of single block, thereby greatly modifying insertion loss or electrical isolation effect of the overall solid-state device. However, in the macroscopic world of the entire package structure, the MEMS device is extremely fragile and may be impacted by slight static electricity or surface tension at any moment to cause failure. Therefore, in order to prevent the MEMS device from contaminations or damages, currently, the MEMS device integrated with the IC in a manner of single block is sealed in a space between the base and the cover by glue. However, glue may crack and occur the outgassing phenomena easily in the high temperature and high humidity environment, so that the moisture may permeate into the space between the base and the cover easily after using a period of time in high temperature and high humidity environment, thereby affecting the normal operation of the MEMS device.

SUMMARY OF THE INVENTION

Accordingly, the present invention is directed to a MEMS package structure which provides better moisture resistance property.

Accordingly, the present invention is directed to a manufacturing method of the above-mentioned MEMS package structure.

The present invention provides a microelectromechanical system (MEMS) package structure comprising a base, a MEMS device, a first cover, a second cover and a glass frit. The base comprises a recess. The MEMS device is disposed in the recess. The first cover is disposed in the recess and covering the MEMS device. The second cover is disposed on the base and covering the recess. The glass frit is disposed between the base and the second cover so as to seal the recess.

According to an embodiment of the present invention, the coefficients of thermal expansion of the base, the glass frit and the second cover are substantially similar.

The present invention provides a microelectromechanical system (MEMS) package structure comprising a base, a MEMS device, a first cover, a second cover, a first metal frame and a first sealing medium. The base comprises a recess. The MEMS device is disposed in the recess. The first cover is disposed in the recess and covering the MEMS device. The first metal frame is disposed around the second cover, and the second cover and the first metal frame collectively are disposed on the base and covering the recess. The first sealing medium is disposed between the first metal frame and the base.

According to an embodiment of the present invention, the first metal frame is fixed to the second cover directly.

According to an embodiment of the present invention, the first metal frame is fixed to the second cover through a glass frit.

According to an embodiment of the present invention, the coefficients of thermal expansion of the first metal frame, the glass frit and the second cover are substantially similar.

According to an embodiment of the present invention, the MEMS package structure further comprises a second metal frame and a second sealing medium. The second metal frame is disposed between the first metal frame and the first sealing medium. The second sealing medium is disposed between the first metal frame and the second metal frame.

The present invention provides a manufacturing method of a microelectromechanical system (MEMS) package structure, comprising providing a base, wherein the base comprises a recess; disposing a MEMS device covered by a first cover in the recess; disposing a glass frit on a second cover or the base; disposing the second cover on the base, wherein the second cover covers the recess, and the glass frit is disposed between the base and the second cover; and heating the glass frit so as to seal the recess.

According to an embodiment of the present invention, before the melting step, the manufacturing method further comprises heating the glass frit to an intermediate temperature which is less than a melting temperature of the glass frit.

According to an embodiment of the present invention, the coefficients of thermal expansion of the base, the glass frit and the second cover are substantially similar.

The present invention provides a manufacturing method of a microelectromechanical system (MEMS) package structure comprising providing a base, wherein the base comprises a recess; disposing a MEMS device covered by a first cover in the recess; providing a second cover and disposing a first metal frame around the second cover; disposing a first sealing medium on the base or the first metal frame; disposing the second cover and the first metal frame on the base collectively, wherein the second cover and the first metal frame cover the recess, and the first sealing medium is disposed between the first metal frame and the base; and heating the first sealing medium so as to seal the first metal frame and the base.

According to an embodiment of the present invention, in the step of disposing the first metal frame around the second cover, the manufacturing method further comprises heating to a softening temperature of the second cover so that the second cover is fixed to the first metal frame; and polishing the second cover.

According to an embodiment of the present invention, before the step of heating to the softening temperature of the second cover, the manufacturing method further comprises proceeding a high temperature oxidation process of the first metal frame.

According to an embodiment of the present invention, in the step of disposing the first metal frame around the second cover, the manufacturing method further comprises disposing a glass frit between the first metal frame and the second cover; and melting the glass frit, so that the first metal frame is fixed to the second cover.

According to an embodiment of the present invention, the coefficients of thermal expansion of the first metal frame, the glass frit and the second cover are substantially similar.

According to an embodiment of the present invention, the manufacturing method further comprises disposing a second metal frame on the first sealing medium; disposing a second sealing medium on the second metal frame, wherein the second sealing medium is disposed between the first metal frame and the second metal frame; and heating the second sealing medium to seal the first metal frame and the second metal frame.

Based on the above-mentioned description, the MEMS package structure of the present invention applies the first cover covering the MEMS device to prevent the MEMS device from pollution and to provide a first moisture protection for the MEMS device. In addition, the MEMS device and the first cover are disposed in the recess of the base, the second cover is sealed to the base through the glass fit or the first metal frame around the second cover is sealed to the base through the first sealing medium, so that the combination of the second cover, the base and the glass frit or the combination of the second cover, the base, the first metal frame and the first sealing medium provide the second moisture protection for the MEMS device. In tradition, the second cover is adhered to the base by glue, it may occur the moisture penetrating issue and the outgassing issue of the glue in high temperature environment. In the MEMS package structures of the present invention, the glass frit and the first metal frame around the second cover and the first sealing medium replace the glue, so that air tightness of the recess can be improved and the outgassing issue can be prevented. Therefore, the MEMS package structure of the present invention provides better moisture resistance property. Moreover, the manufacturing methods of the above-mentioned MEMS package structure are further provided.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 2A to FIG. 2E are schematic views of a manufacturing method of a MEMS package structure according to another embodiment of the invention.

FIG. 2D' to FIG. 2E' are schematic views of a manufacturing method of a MEMS package structure according to another embodiment of the invention.

FIG. 2D" to FIG. 2E" are schematic views of a manufacturing method of a MEMS package structure according to another embodiment of the invention.

DESCRIPTION OF THE EMBODIMENTS

Figure 1A:
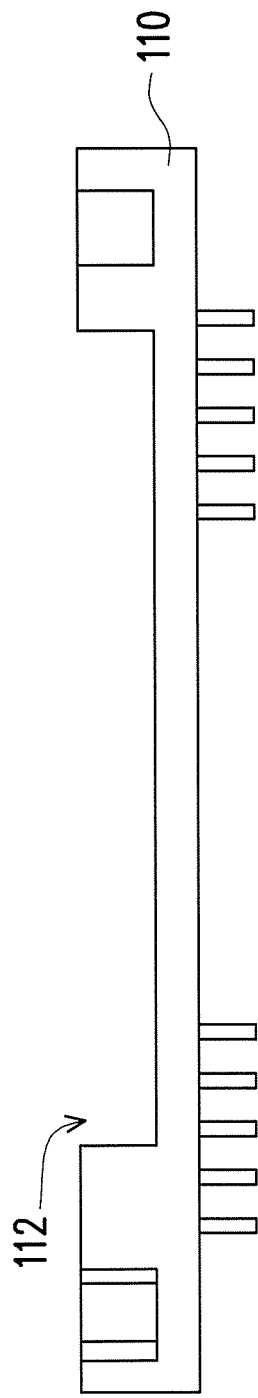
FIG. 1A to FIG. 1D are schematic views of a manufacturing method of a MEMS package structure according to an embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1A to FIG. 1D are schematic views of a manufacturing method of a MEMS package structure according to an embodiment of the invention. A manufacturing method of a microelectromechanical system (MEMS) package structure comprises the following steps. Referring to FIG. 1A, provide a base 110, wherein the base 110 comprises a recess 112. In the embodiment, material of the base 110 is ceramic, but material of the base 110 is not limited thereto.

Figure 1B:
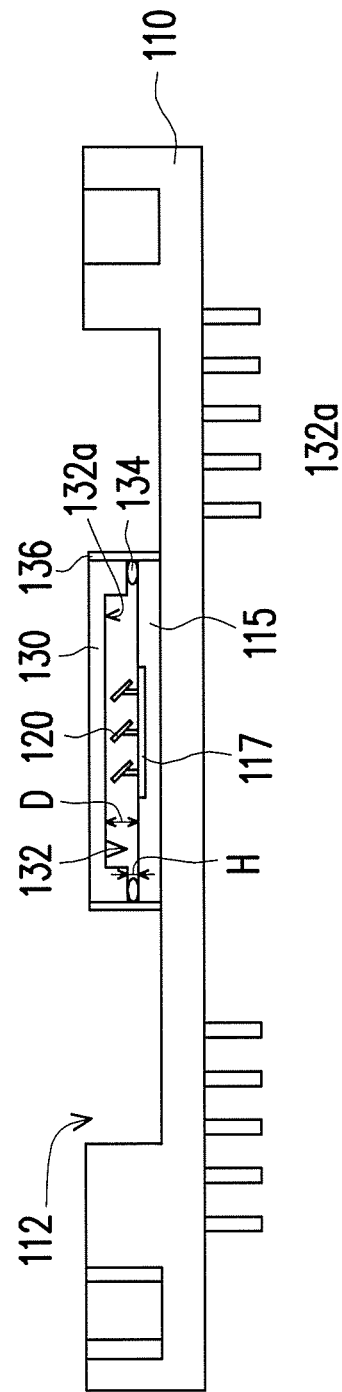

Then, referring to FIG. 1B, dispose at least one MEMS device 120 covered by a first cover 130 in the recess 112 of the base 120. The first cover 130 covering on the MEMS devices 120 is capable of preventing the MEMS devices 120 from pollution (such as particles). In detail, in the embodiment, the MEMS devices 120 are disposed on an active surface 117 of a chip 115. The chip 115 is, for example, an optical sensor chip such as a charge couple device (CCD) or a complementary metal-oxide-semiconductor (CMOS), and the active surface 117 is, for example, a photo sensitive region. But the types of the chip 115 and the active surface 117 are not limited thereto. In the embodiment, the MEMS devices 120 are mirrors, but the MEMS devices 120 also can be switches, capacitors, accelerometers, sensors or actuators, the type of the MEMS 120 device is not limited thereto.

The first cover 130 is transparent, so that an external light beam (not shown) is capable of passing through the first cover 130 to the MEMS devices 120 and the active surface 117 of the chip 115. The first cover 130 is a glass cover, but material of the first cover 130 is not limited thereto. As shown in FIG. 1B, the first cover 130 covers on the chip 115 and comprises a cavity 132, and the MEMS device 120 is in the cavity 132. The cavity 132 has a top surface 132a opposite to the active surface 117. In the embodiment, a distance D between the top surface 132a and the active surface 117 is larger than mirror tilt height, for example 10 micrometer, and a height H of a peripheral gap between the chip 115 and the first cover 130 is approximately from 1 micrometer to 10 micrometer. That is, the height H of the peripheral gap between the chip 115 and the first cover 130 is less than the distance D between the top surface 132a and the active surface 117.

The sealant 134 is disposed at the peripheral gap between the chip 115 and the first cover 130 so as to seal the cavity 132. As shown in FIG. 1B, a thickness of the sealant 134 is less than a height of the MEMS device 120. The thickness of the sealant 134 is limited by the height H of the peripheral gap between the chip 115 and the first cover 130. Therefore, the thickness of the sealant 134 is approximately from 1 micrometer to 10 micrometer varied with the height H of the peripheral gap between the chip 115 and the first cover 130.

It should be noted that the sealant 134 is an organic polymer compound, for example, an epoxy resin. The molecular structure of the organic compound has many hydrophilic groups, thus having the ability to block the external contamination and moisture, but the molecular structure cannot totally block the reaction of the hydrophilic groups and the moisture. Therefore, in the embodiment, the moisture barrier 136 is coated around the chip 115, the sealant 134 and the first cover 130 so as to effectively block the reaction of the hydrophilic groups of the sealant 134 and the moisture, and further enhance the impermeability of the cavity 132. In this manner, the MEMS devices 120 are able to operate normally in the MEMS package structure 100.

In this embodiment, the moisture barrier 136 can be fanned by the chemical vapor deposition (CVD) or physical vapor deposition (PVD) technique, but the forming method of the moisture barrier 136 is not limited thereto. In addition, a material of the moisture barrier 136 can be an inorganic insulating material with a higher compaction, for example, silica, silicon nitride, silicon oxynitride, or other nitride, oxide, and oxynitride which do not contain the hydrophilic group, so the moisture resistance of the moisture barrier 136 is stronger than that of the sealant 134. That is, the inorganic insulating material does not have the hydrophilic group, and will not react with the moisture, thereby effectively isolating the moisture. Hence, the moisture barrier 136 is able to provide a double protection, so that a permeating probability of the moisture can be lowered.

It is worth noting that the configuration of the MEMS devices 120 and the first cover 130 in FIG. 1B is one of the embodiments, the configuration of the MEMS devices 120 and the first cover 130 is not limited thereto.

Figure 1C:
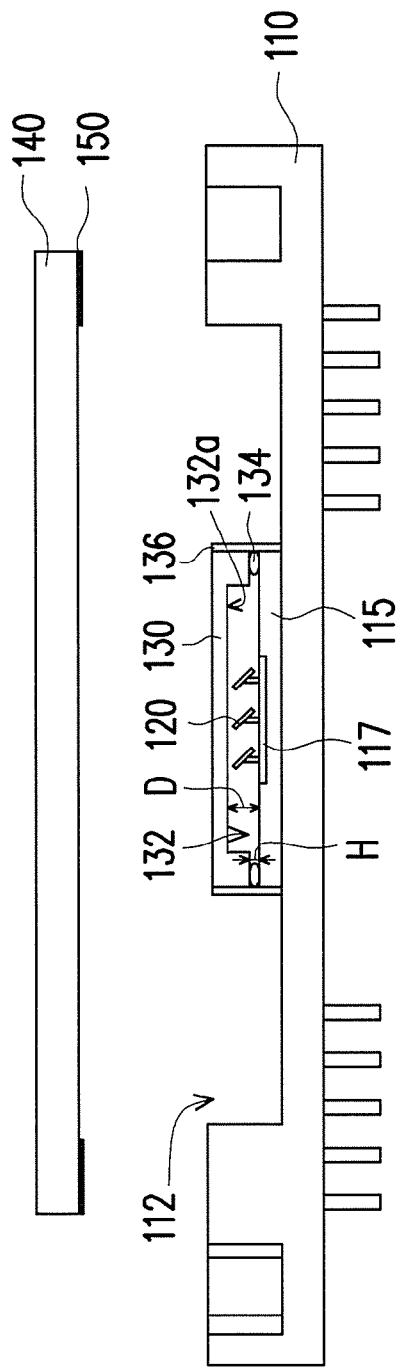

Then, referring to FIG. 1C, dispose a glass frit 150 on a second cover 140. The second cover 140 is a glass cover, the glass frit 150 applies to a bottom surface of the second cover 140. In the embodiment, the glass frit 150 is a ring shape, but the shape of the glass frit 150 is not limited thereto. The glass frit 150 is used for fixing the second cover 140 and the base so as to seal the recess 112. Due to the material property of the glass frit 150, the glass frit 150 is capable of providing better efficiency of blocking moisture. In the embodiment, in order to lower the crack possibility of the glass fit 150 in high temperature environment, the gas organic additive in the glass fit 150 should be removed. In the embodiment, the gas organic additive in the glass frit 150 is removed by two-step heating to proceed an outgassing procedure. First, the glass frit 150 is heated to an intermediate temperature which is less than a melting temperature of the glass frit 150. In the step, the glass frit 150 does not fully melt yet at this time. After that, the glass frit 150 is heated to the melting temperature to melt fully, so that the glass frit 150 without gas included is formed. In other embodiment, the glass frit 150 also can be disposed on the base 110.

Figure 1D:
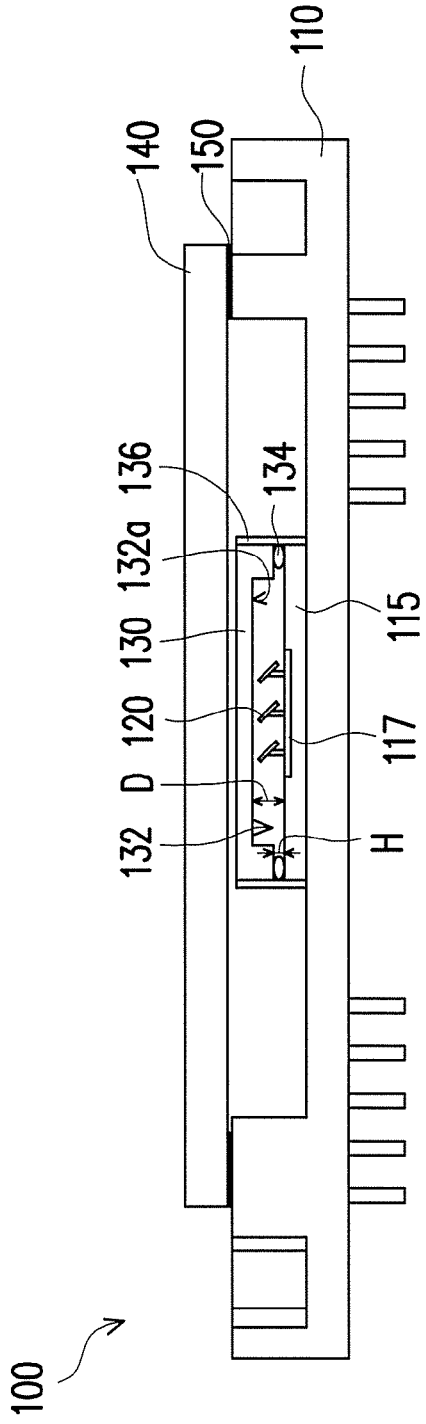

Referring to FIG. 1D, dispose the second cover 140 on the base 110, wherein the second cover 140 covers the recess 112, and the glass frit 150 is disposed between the base 110 and the second cover 140. And then, heat the glass frit 150 to the melting temperature so as to seal the recess 112, and a MEMS package structure 100 is form. In the embodiment, the glass frit 150 is melted by laser, but the heating method for the glass frit 150 is not limited thereto. It is worth to noting that the coefficients of thermal expansion of the base 110, the glass fit 150 and the second cover 140 are substantially similar. In this way, even the MEMS package structure 100 deforms slightly in high temperature environment, the glass fit 150 does not crack easily, so that gas or steam outside can be blocked by the glass frit 150.

As shown in FIG. 1D, the MEMS package structure 100 comprises the base 110, the MEMS devices 120, the first cover 130, the second cover 140 and the glass frit 150. The base 110 comprises the recess 112. The MEMS devices 120 are disposed in the recess 112. The first cover 130 is disposed in the recess 112 and covering the MEMS device 120. The second cover 140 is disposed on the base 110 and covering the recess 112. The glass frit 150 is disposed between the base 110 and the second cover 140 so as to seal the recess 112.

The MEMS package structure 100 applies the first cover 130 covering the MEMS devices 120 to prevent the MEMS devices 120 from pollution and to provide a first moisture protection for the MEMS devices 120. In addition, the MEMS devices 120 and the first cover 130 are disposed in the recess 112 of the base 110, the second cover 140 is sealed to the base 110 through the glass frit 150, so that the configuration of the second cover 140, the glass frit 150 and the base 110 provide the second moisture protection for the MEMS device 100.

FIG. 2A to FIG. 2E are schematic views of a manufacturing method of a MEMS package structure according to another embodiment of the invention. Another manufacturing method of a microelectromechanical system (MEMS) package structure is further provided. The manufacturing method comprises the following steps.

Referring to FIG. 2A, provide a base 210, wherein the base 210 comprises a recess 212. In the embodiment, material of the base 210 is ceramic, but material of the base 210 is not limited thereto. And then, referring to FIG. 2B, dispose a first sealing medium 280 on the base 210, and dispose a second metal frame 290 on the first sealing medium 280. Then, heat the first sealing medium 280 to fix the second metal frame 290 and the base 210. In the embodiment, the first sealing medium 280 can be an inorganic material, such as a metal, a metal alloy, a metal compound (e.g. a metal or metalloid oxide) or a glass frit. More specifically, material of the first sealing medium 280 may be AgCu, AuSn, BiSn, InAg or the glass frit. The melting point of the first sealing medium 280 varies with material, and the melting point of the first sealing medium 280 is generally between about 160° C. and about 400° C. In addition, in the embodiment, material of the second metal frame 290 is the Kovar alloy, for example. The Kovar alloy is made of the nickle, copper, cobalt, iron and manganese. Certianly, material of the second metal frame 290 is not limited thereto.

Referring to FIG. 2C, disposes at least one MEMS device 220 covered by a first cover 230 in the recess 212. The types and configurations of the MEMS devices 220 and the first cover 230 of the embodiment are similar to the types and configurations of the MEMS devices 120 and the first cover 130 of the above-mentioned embodiment, it does not describe the MEMS devices 220 and first cover 230 in detail here. Certainly, in other embodiment, the types and configurations of the MEMS devices 220 and the first cover 230 also can be different from the configurations of the MEMS devices 120 and the first cover 130 shown in FIG. 1B.

Figure 2E:
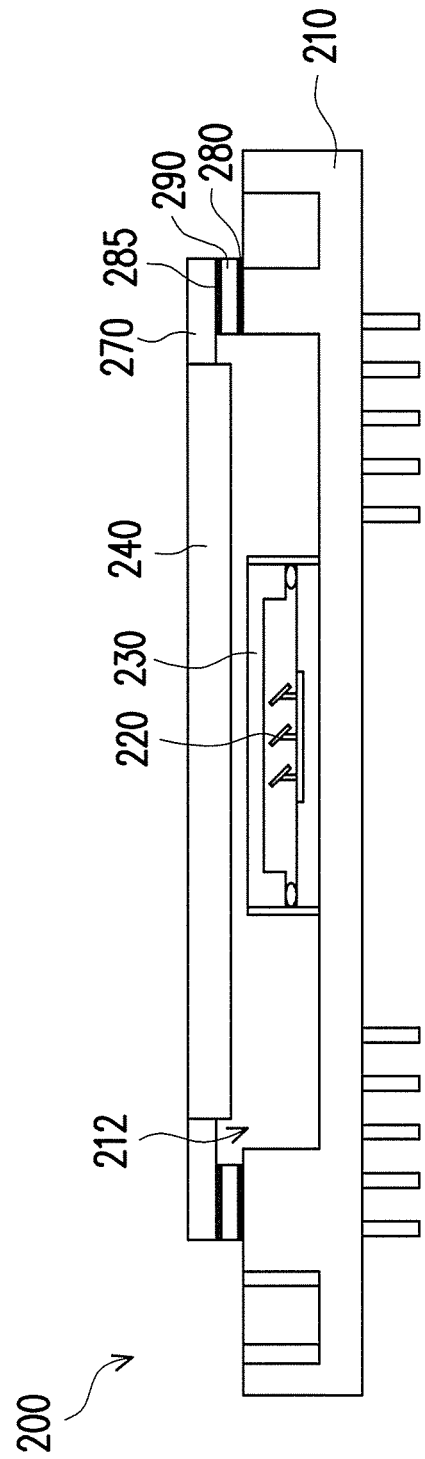
Figure 2D:
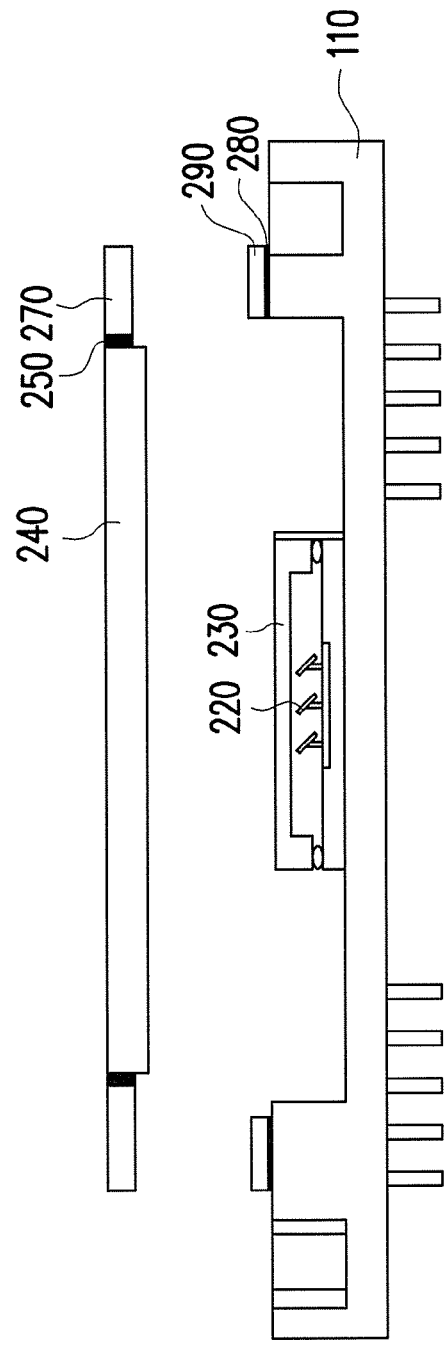
Figure 2E:
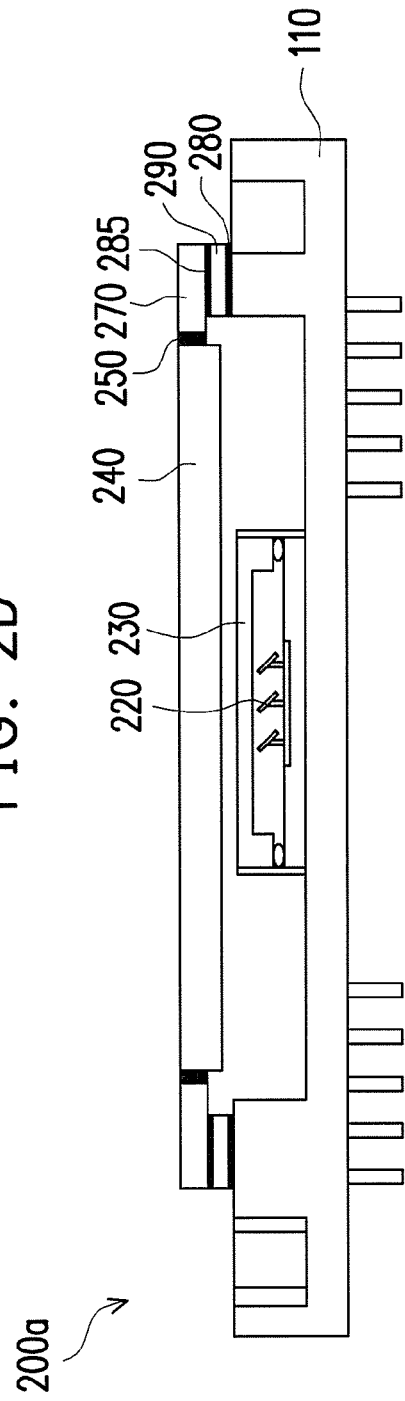
Figure 2D:
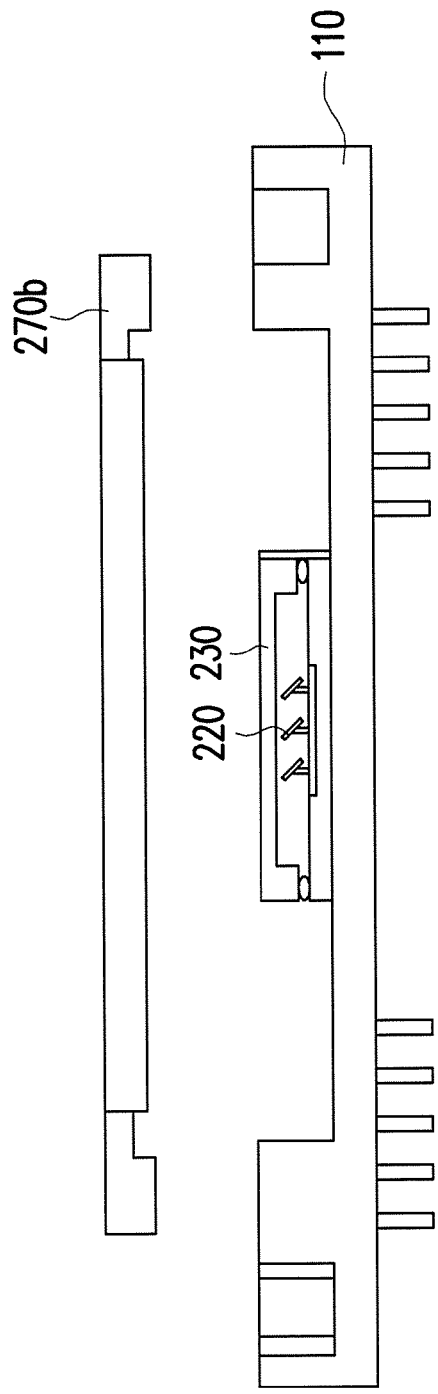
Figure 2E:
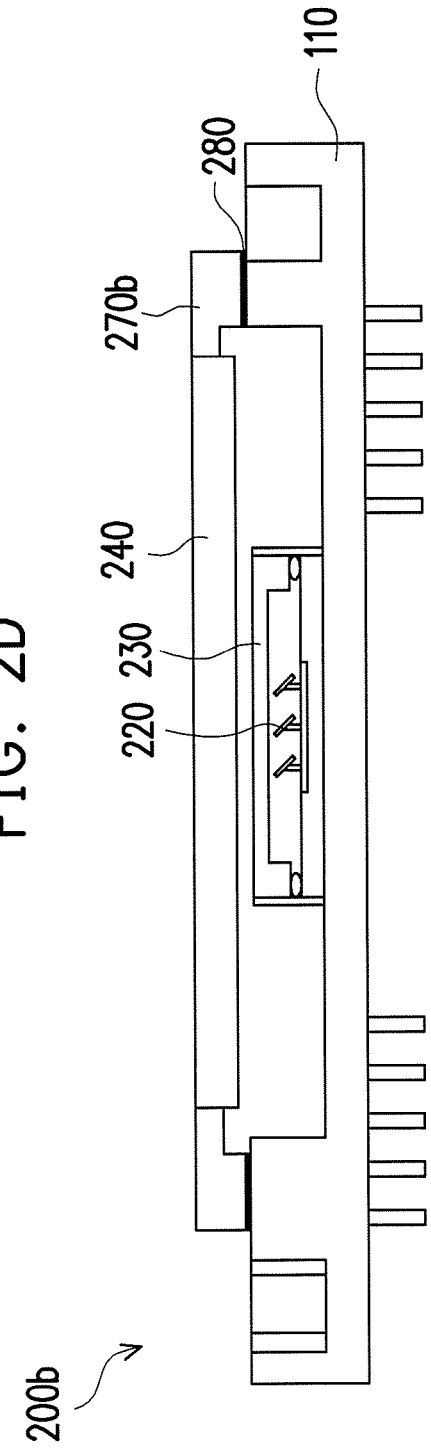

Referring to FIG. 2D, provide a second cover 240 and dispose a first metal frame 270 around the second cover 240. In the embodiment, material of the first metal frame 270 is the Kovar alloy, for example. The Kovar alloy is made of the nickle, copper, cobalt, iron and manganese. Certianly, material of the first metal frame 270 is not limited thereto. In the embodiment, the first metal frame 270 is fixed around the second cover 240 directly by fusion in high temperature. Before fixing the first metal frame 270 to the second cover 240, the first metal frame 270 can proceed a high temperature oxidation process, first. In the high temperature oxidation process, the first metal frame 270 is heated to about 600° C. The high temperature oxidation process of the first metal frame 270 can improve the following fusion of the first metal frame 270 and the second cover 240, so that the first metal frame 270 and the second cover 240 can fix hermetically.

After the high temperature oxidation process, the first metal frame 270 and the second cover 240 are heated to a softening temperature of the second cover 240 so that the second cover 240 is fixed to the first metal frame 270. In the embodiment, the first metal frame 270 and the second cover 240 are heated to about 900° C., so that the second cover 240 fuses and welds to the first metal frame 270. Certainly, the temperature of the softening temperature of the second cover 240 is not limited thereto.

After the fixing step, because the molecular arrangement of the second cover 240 might change in high temperature environment, transmittance of the second cover 240 may decreases. Therefore, an upper surface and a bottom surface of the second cover 240 may be polished to increase transmittance. And then, a black pattern (such as optical Cr pattern and AR, not shown) may be coated on the upper surface or the bottom surface of the second cover 240 for shielding light.

Then, referring to FIG. 2E, dispose a second sealing medium 285 on the second metal frame 290, and dispose the first metal frame 270 on the second sealing medium 285, so that the second cover 240 and the first metal frame 270 can be fixed to the base 210 and cover the recess 212 collectively. Specifically, in the embodiment, a thickness of the first metal frame 270 is less than a thickness of the second cover 240, if the first metal frame 270 is disposed on the first sealing medium 280 directly, a lower part of the second cover 240 may be sited in the recess 212 and hit the first cover 230. Therefore, in the embodiment, the second metal frame 290 is disposed on the first sealing medium 280, the second sealing medium 285 is disposed on the second metal frame 290, and the first metal frame 270 is disposed on the second sealing medium 285. The second metal frame 290 is capable of being regarded as an extension of the first metal frame 270, so that a space between the first cover 230 and the second cover 240 is yielded. And then, heat the second sealing medium 285 to seal the first metal frame 270 and the second metal frame 290, so that the recess 212 is sealed. After that, the MEMS package structure 200 is formed.

It is necessary to say that the order of the step that the first sealing medium 280 and the second metal frame 290 are disposed on the base 210 is not limited thereto, as long as before the step of fixing the first metal frame 270 to the base 210. In addition, in other embodiment, the second sealing medium 285, the second metal frame 290, and the first sealing medium 280 also can be disposed on the bottom surface of the first metal frame 270 sequentially, and then the second cover 240, the first metal frame 270, the second sealing medium 285, the second metal frame 290, and the first sealing medium 280 are as a whole to be disposed on the base 210.

In addition, it is worth noting that the coefficients of thermal expansion of the base 210, the first sealing medium 280, and the second metal frame 290 are substantially similar, and the coefficients of thermal expansion of the first metal frame 270, the second sealing medium 285, and the second metal frame 290 are substantially similar so as to keep the air tightness of the recess 212.

As shown in FIG. 2E, the MEMS package structure 200 comprises the base 210, the MEMS devices 220, the first cover 230, the second cover 240, the first metal frame 270, the first sealing medium 280, the second metal frame 290 and the second sealing medium 285. The base 210 comprises the recess 212. The MEMS devices 220 are disposed in the recess 212. The first cover 230 is disposed in the recess 212 and covering the MEMS devices 220. The first metal frame 270 is disposed around the second cover 240, and the first metal frame 270 is fixed to the second cover 240 directly. The first sealing medium 280 is disposed on the base 210. The second metal frame 290 is disposed on the first sealing medium 280. The second metal frame 285 is disposed on the second metal frame 290. The second cover 240 and the first metal frame 270 collectively are disposed on the second metal frame 285 and covering the recess 210.

The MEMS package structure 200 applies the first cover 230 covering the MEMS devices 220 to prevent the MEMS devices 220 from pollution and to provide a first moisture protection for the MEMS devices 220. In addition, the MEMS devices 220 and the first cover 230 are disposed in the recess 212 of the base 210, the first metal frame 270 around the second cover 240 is sealed to the base 210 through the first sealing medium 280, the second metal frame 290 and the second sealing medium 285. In the embodiment, the configuration of the second cover 240, the base 210, the first metal frame 270, the first sealing medium 280, the second metal frame 290 and the second sealing medium 285 provide the second moisture protection for the MEMS device 200.

Certainly, the form of the first metal frame 270 disposed around the second cover 240 is not limited thereto. FIG. 2D' to FIG. 2E' are schematic views of a manufacturing method of a MEMS package structure according to another embodiment of the invention. The elements of the embodiment similar to the elements of the above-mentioned embodiment use the same number to present. Please refer to FIG. 2D' and FIG. 2E', a main difference between the MEMS package structure 200a of FIG. 2E' and the MEMS package structure 200 of FIG. 2E is that the first metal frame 270 does not contact the second cover 240 directly in the embodiment. Specifically, the glass frit 250 is disposed between the first metal frame 270 and the second cover 240. In other words, the first metal frame 270 is fixed the second cover 240 by the glass frit 250. In the embodiment, the glass frit 250 is a ring shape. In the fixing step of the first metal frame 270 and the second cover 240, the glass frit 250 is disposed between the first metal frame 270 and the second cover 240, and then the glass fit 250 is heated to melt, so that the first metal frame 270 is fixed to the second cover 240. The heating temperature of the glass frit 250 is about 350° C. to 550° C. In addition, the coefficients of thermal expansion of the first metal frame 270, the glass fit 250 and the second cover 240 are substantially similar, so that the crack possibility of the glass frit 250 in high temperature can be lowered.

FIG. 2D" to FIG. 2E" are schematic views of a manufacturing method of a MEMS package structure according to another embodiment of the invention. The elements of the embodiment similar to the elements of the first embodiment use the same number to present. Please refer to FIG. 2D" and FIG. 2E", a main difference between the MEMS package structure 200b of FIG. 2E" and the MEMS package structure 200 of FIG. 2E is that the first metal frame 270b is fixed to the base 210 only through the first sealing medium 280. In the embodiment, a thickness of at least a part of the first metal frame 270b is not less than a thickness of the second cover 240, so that the second cover 240 would not contact the first cover 230 when the first metal frame 270 is disposed on the first sealing medium 280 directly. Therefore, the MEMS package structure 200b does not need the second metal frame and the second sealing medium to increase a space between the first cover 230 and the second cover 240, the second metal frame and the second sealing medium mentioned in the embodiment above can be omitted in the MEMS package structure 200b.

Based on the above-mentioned description, the MEMS package structure of the present invention applies the first cover covering the MEMS device to prevent the MEMS device from pollution and to provide a first moisture protection for the MEMS device. In addition, the MEMS device and the first cover are disposed in the recess of the base, the second cover is sealed to the base through the glass frit or the first metal frame around the second cover is sealed to the base through the first sealing medium, so that the combination of the second cover, the base and the glass frit or the combination of the second cover, the base, the first metal frame and the first sealing medium provide the second moisture protection for the MEMS device. In tradition, the second cover is adhered to the base by glue, it may occur the moisture penetrating issue and the outgassing issue of the glue in high temperature environment. In the MEMS package structures of the present invention, the glass frit and the first metal frame around the second cover and the first sealing medium replace the glue, so that air tightness of the recess can be improved and the outgassing issue can be prevented. Therefore, the MEMS package structure of the present invention provides better moisture resistance property. Moreover, the manufacturing methods of the above-mentioned MEMS package structure are further provided.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A microelectromechanical system (MEMS) package structure, comprising:

a base, comprising a recess;
a chip, disposed in the recess and having an active surface;
a MEMS device, disposed on the active surface and in the recess;
a first cover, disposed in the recess and covering the MEMS device, wherein the first cover comprises a cavity, and the MEMS device is in the cavity;
a sealant, disposed at a peripheral gap between the chip and the first cover so as to seal the cavity;
a second cover, disposed on the base and covering the recess; and
a glass frit, disposed between the base and the second cover so as to seal the recess.

2. The MEMS package structure according to claim 1, wherein the coefficients of thermal expansion of the base, the glass frit and the second cover are substantially similar.

* * * * *